United States Patent
Zagolla et al.

(10) Patent No.: US 9,602,047 B2
(45) Date of Patent: Mar. 21, 2017

(12)

(54) SELF-TRACKING SOLAR CONCENTRATOR DEVICE

(71) Applicant: Ecole Polytechnique Fédérale de Lausanne (EPFL), Lausanne (CH)

(72) Inventors: Volker Zagolla, Lausanne (CH); Christophe Moser, Lausanne (CH); Jacques-Edouard Moser, Renens (CH)

(73) Assignee: ECOLE POLYTECHNIQUE FEDERALE DE LAUSANNE (EPLF), Lausanne (CH)

( * ) Notice: Subject to any disclaimer, the term of this patent is extended or adjusted under 35 U.S.C. 154(b) by 0 days.

(21) Appl. No.: 15/079,067

(22) Filed: Mar. 24, 2016

(65) Prior Publication Data

US 2016/0282614 A1    Sep. 29, 2016

(30) Foreign Application Priority Data

Mar. 24, 2015  (WO) ................. PCT/IB2015/052153

(51) Int. Cl.
*H02S 40/22* (2014.01)
*H02S 20/32* (2014.01)
(Continued)

(52) U.S. Cl.
CPC .............. *H02S 40/22* (2014.12); *C09K 5/063* (2013.01); *G02B 3/0062* (2013.01); *G02B 5/09* (2013.01);
(Continued)

(58) Field of Classification Search
CPC .......... H02S 40/20; H02S 40/22; H02S 20/30; H02S 20/32; C09K 5/06; C09K 5/063; C09K 5/02; C09K 5/04; G02B 3/0062; G02B 5/04; G02B 5/045; G02B 5/06; G02B 5/09; G02B 6/0016; G02B 6/0018; G02B 6/0023; G02B 6/10; G02B 19/0028; G02B 19/0042; G02B 26/0875; G02F 1/0054

See application file for complete search history.

(56) References Cited

U.S. PATENT DOCUMENTS 8,040,609 B1    10/2011   Schmaelzle et al.
8,884,156 B2    11/2014   Schmaelzle et al.
(Continued)

FOREIGN PATENT DOCUMENTS

WO    WO2013150453    10/2013

OTHER PUBLICATIONS

E.J. Tremblay et al., "Thermal phase change actuator for self-tracking solar concentration," Opt. Express, vol. 20, pp. A964-A976, 2012.
(Continued)

*Primary Examiner* — Susan D Leong
(74) *Attorney, Agent, or Firm* — Andre Roland S.A.; Nikolaus Schibli

(57) ABSTRACT

A device for self-tracking a light source, including a focusing optical device configured to focus incoming light to a focal spot, an adaptive device configured to reflect the light of the focal spot and arranged to provide for a phase change at an area of the focal spot of the incoming light to generate a reflected light, and a light guide located between the focusing optical device and the adaptive device, the light guide configured to capture the reflected light of the adaptive device.

11 Claims, 6 Drawing Sheets

(51) Int. Cl.
*G02B 6/10* (2006.01)
*G02B 19/00* (2006.01)
*C09K 5/06* (2006.01)
*G02B 5/04* (2006.01)
*G02F 1/00* (2006.01)
*G02B 5/09* (2006.01)
*G02B 3/00* (2006.01)
*G02B 26/08* (2006.01)
*G02B 5/136* (2006.01)

(52) U.S. Cl.
CPC ............ *G02B 6/10* (2013.01); *G02B 19/0028* (2013.01); *G02B 19/0042* (2013.01); *G02B 26/0875* (2013.01); *G02F 1/0054* (2013.01); *H02S 20/32* (2014.12); *G02B 5/136* (2013.01)

(56) References Cited

U.S. PATENT DOCUMENTS

2008/0041440 A1* 2/2008 O'Connell .......... H01L 31/0543
136/246
2011/0226332 A1 9/2011 Ford et al.
2012/0056081 A1 3/2012 Kozodoy
2012/0097149 A1* 4/2012 Doyle ..................... F24J 2/10
126/604

OTHER PUBLICATIONS

K. A. Baker et al., "Reactive self-tracking solar concentrators: concept, design, and initial materials characterization," Appl. Opt., vol. 51, pp. 1086-1094, 2012.

Marco Stefancich et al., "Switchable transparency optical element for reactive solar tracking" Proc. SPIE 9191, Nonimaging Optics: Efficient Design for Illumination and Solar Concentration XI, 91910E, Sep. 5, 2014.

P. H. Schmaelzle et al., "Lower Critical Solution Temperature (LCST) Polymers as a Self Adaptive Alternative to Mechanical Tracking for Solar Energy Harvesting Devices." Materials Research Society (MRS), Fall Meeting, 2010, Abstract.

V. Zagolla et al., "Proof of principle demonstration of a self-tracking concentrator," Opt. Express, vol. 22, pp. A498-A510, 2014.

Volker Zagolla et al., "Self-tracking solar concentrator with an acceptance angle of 32°," Opt. Express vol. 22, pp. A1880-A1894, 2014.

* cited by examiner

SELF-TRACKING SOLAR CONCENTRATOR DEVICE

CROSS-REFERENCE TO RELATED APPLICATIONS

The present invention claims foreign priority to International Patent Application PCT/IB2015/052153 that was filed on Mar. 24, 2015, the entire contents thereof being incorporated by reference.

FIELD OF THE INVENTION

The present invention relates to solar energy and solar lighting systems, in particular systems that operate at least in part by way of concentrating sunlight for the purposes of converting sunlight to electricity or channeling sunlight into buildings for lighting.

BACKGROUND

Solar concentration aims to decrease the use of expensive photovoltaic materials by reducing the solar cell size and adding an optical system to focus the sunlight onto the solar cell. This reduces the quantity of solar cell material used in the system at the expense of adding the need for a tracking system in order to keep the focal spot on the reduced solar cell. State of the art solar concentrators, mostly using Fresnel lenses or parabolic mirrors, need a tracking precision of less than 1° in two dimensions in order to cover the diurnal and seasonal variations of the sun's position. Such a tracking device consumes energy, decreasing the overall system efficiency, and adds to the cost of the system, thereby diminishing the savings from a smaller solar cell. Accordingly, in light of these deficiencies of the background art, additional, improved, and low-cost systems, devices and methods for solar light concentration and self-tracking are strongly desired. In this respect, self-tracking concentrators have the potential to increase the acceptance angle of a solar concentration system and thereby greatly reduce the need for tracking.

SUMMARY

According to one aspect of the present invention, a device is provided that can permit a solar concentration with the added benefit of following reactively the sun's position in the sky. With this device, a self-tracking mechanism can be provided that allows for several solar concentrator system embodiments, preferably including a solar concentration system without any external active mechanical tracking, or a solar concentrating system with coarse mechanical alignment for which fine alignment is achieved by the self-tracking mechanism.

According to still another aspect of the present invention, a device for self-tracking a light source is provided. Preferably, the device includes an focusing optical device configured to focus incoming light to a focal spot; and an adaptive device configured to reflect the light of the focal spot and arranged to provide for a phase change at an area of the focal spot of the incoming light to generate a reflected light. Moreover, the device further preferably includes a light guide located between the focusing optical device and the adaptive device, the light guide configured to capture the reflected light of the adaptive device.

According to yet another aspect of the present invention, a device for converting solar light into electrical energy is provided. The device preferably includes a focusing optical device configured to focus incoming solar light to a focal spot, an adaptive device configured to reflect the incoming solar light of the focal spot and arranged to provide for a phase change at an area of the focal spot of the solar incoming light to generate a reflected light. Moreover, the device further preferably includes a light guide located between the focusing optical device and the adaptive device, the light guide configured to capture the reflected light of the adaptive device, and to guide the light to an exit surface, and a solar cell arranged at the exit surface to capture the guided light exited by the exit surface to generate electrical energy.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

Herein, identical reference numerals are used, where possible, to designate identical elements that are common to the figures. Also, the images are simplified for illustration purposes and may not be depicted to scale.

DETAILED DESCRIPTION OF THE SEVERAL EMBODIMENTS

The techniques, apparatus, materials, and systems as described in this specification can be used to implement a self-tracking solar concentrator, or a self tracking device to track and capture energy of other moving light sources.

Figure 1:
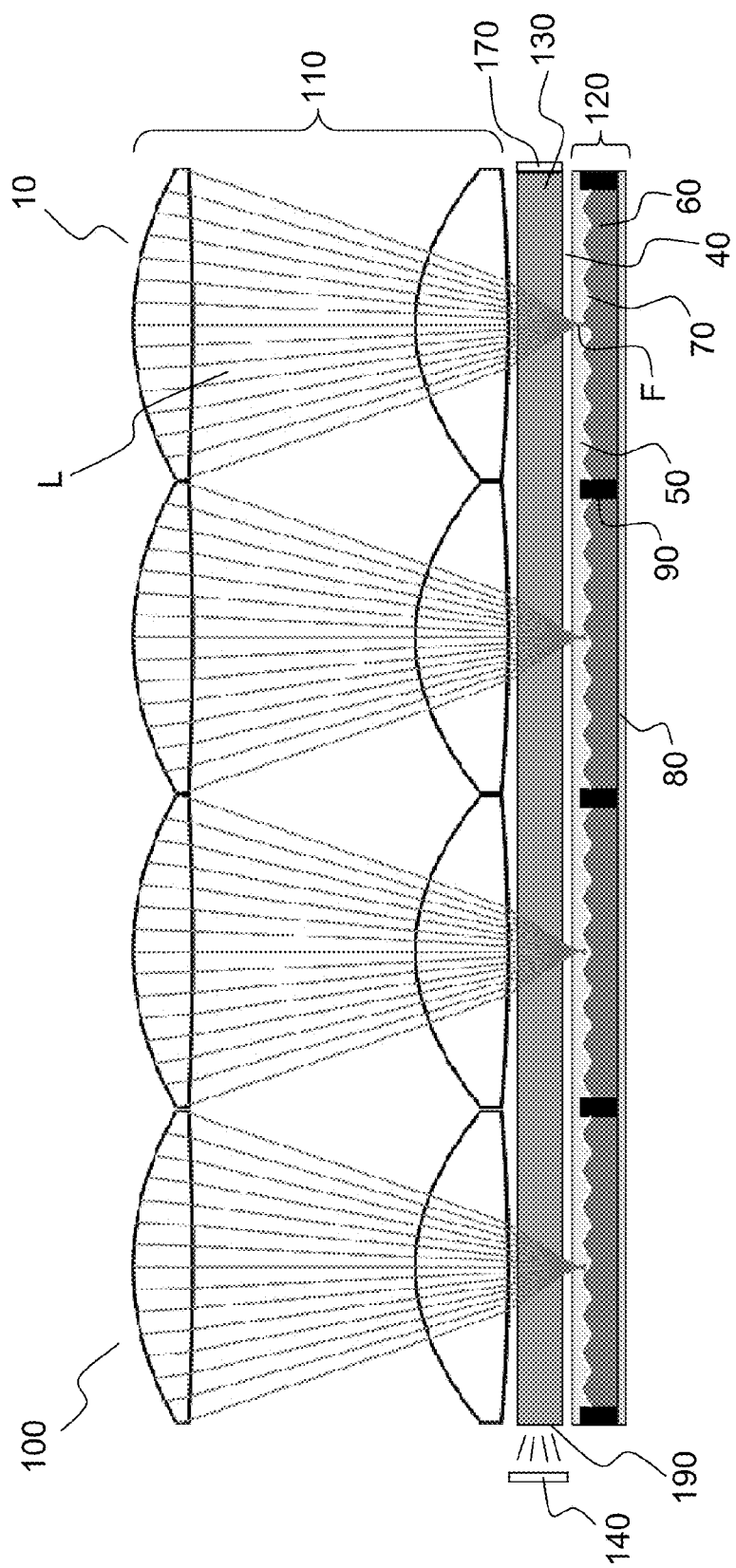
FIG. 1 is as cross-sectional view of the self-tracking concentrator device 100 showing an array of lenses 110, the light guide 130, and an array of actuator 120 located below light guide 130 according to one aspect of the present invention.

According to one aspect of the present invention, FIG. 1 describes a solar concentrator device 100 which includes a plurality of lenses 110, for example but not limited to a two-dimensional lens array with individual lens units 10 for focusing incoming light L, the lenses 110 providing for a plurality of focal spots or points F for projecting light L onto an array of self-adaptive devices 120 via a light guide element 130. In the variant shown, a lens unit 10 the lens array includes two lenses with an upper aspheric lens and a lower aspheric lens for providing focal spot F. Preferably, the lens unit 10 is configured to provide for a flat Petzval field curvature and a small focal spot F. The self-adaptive device 120 includes a plurality of actuators or actuator units 50, a plurality of prisms or gratings 60, and a plurality of reflective layers 70 that coat an upper surface of the prisms 60. Each actuator 50, prisms 60 and reflective layer 70 is associated with a light beam that is focused by a corresponding lens unit 10 of the plurality of lenses 110. A closable gap 40 is formed between upper surface of each actuator 50 and light guide 130.

Between the self-adaptive devices 120 and the plurality of lenses 110, a common light guide 120 is provided that can collect the light reflected by the reflective layers 70 of the self-adaptive device 120. The self-adaptive device 120 actuates thermally where the focal spots F are located, acting as position dependent optical coupler, coupling short wavelength light into light guide 130, as further explained below. In the variant shown, light guide 130 is made as a slab. The incident light L is shown to impinge in a normal direction towards a device 100 and is focused with a plurality of focal spots F onto actuators 50 of the self adaptive device 120 below, where part of the solar spectrum is absorbed to activate the actuators 50. Bonded to a rear face of the plurality of prisms 60, a bottom face of casing 80 is shown, and separation walls 90 are arranged on the casing 80, separating individual actuators 50, prisms 60, and reflective layers 70 from each other, for each cell.

The light guide 130 is configured to capture the reflected light from all of the actuator units 50 reflected by all the reflective layers 70 that are part of the self-adaptive device 120. Thereafter, the light guide 130 can guide all the captured reflected light jointly to an exit surface 190 of the light guide 130. In a variant, assuming that the self-adaptive device 120 is made of an array of n×m units of lenses 10, actuators 50, prisms 60, and reflective layers 70 (n and m being integer numbers), the light guide 130 could be a thin glass layer having a rectangular or square shape that has a size slightly larger to cover the entire array of n×m units, and the four exit surfaces 190 of the light guide 130 could emit the light to an energy conversion device 140, for example a solar array or solar cell device that is arranged to face all four exit surfaces of the light guide 130. Also, in a variant, the light guide can be made as a slab glass waveguide, wherein three or two opposite edge surfaces of the waveguide are coated with an additional reflective layer 170, to only permit light being emitted from one exit surface, or two opposing exit surfaces. In another variant, the light guide 130 can be made as a cubic structure or is made of a rectangular parallelepiped structure.

Figure 3A:
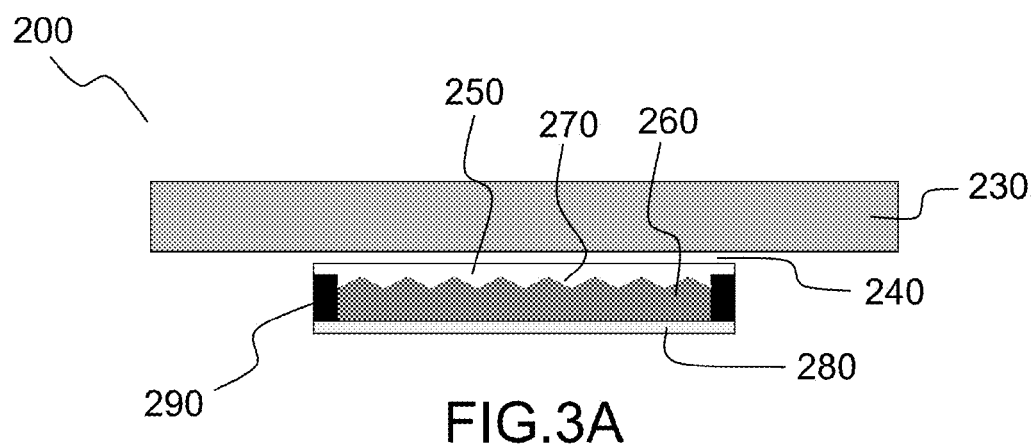
FIGS. 3A-3C shows an embodiment of the actuator 250, with FIGS. 3A showing the device 200 with the actuator 250 located below a light guide 230, with FIGS. 3B-3C showing different stages in illumination by light L, according to still another aspect of the present invention.
Figure 3B:
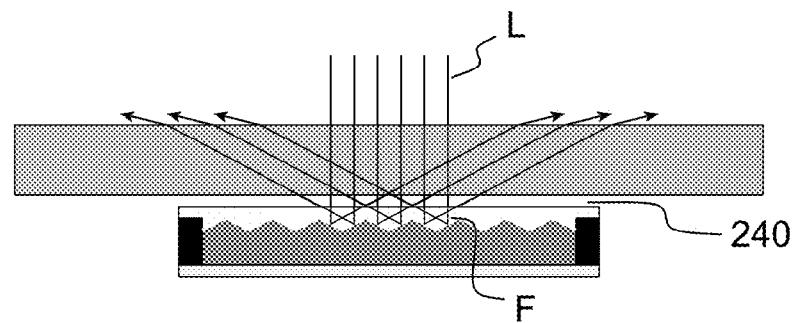
Figure 3C:
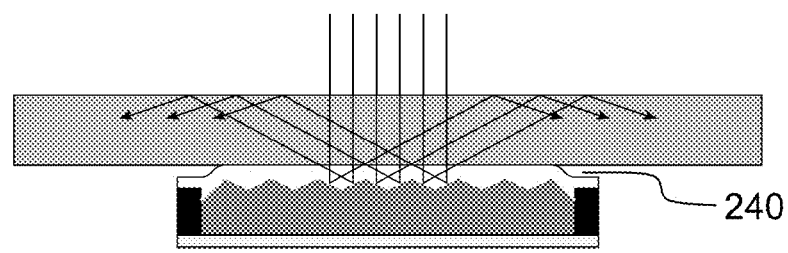

FIG. 3A shows a device 200 according to another embodiment of the present invention, and FIGS. 3B-3C depict different stages of the light propagation with the device 200 shown in FIG. 3A. FIG. 3A shows the solar concentrator device 200 that is associated with a single lens unit (not shown) having a light or wave guide 230, a closeable gap 240, an actuator 250, a prism or an optical grating 260 with a reflective coating 270 that is covered by the actuator 250. Prism 260 is formed on a casing 280. Actuator 250 is formed in direct contact on top of reflective coating or layer 270 of prism 260 with no gaps therebetween. Not shown in this figure are the lenses, lens arrays, and other optical elements that focus incident light L onto actuator 250. The device 200 of FIG. 3A can be arranged linearly or as an array of devices to form a device as shown in FIG. 1. In this embodiment, the prism 260 is made of an elastomer which is patterned with a line prism array or an equivalent optical grating and coated with a reflective material that forms reflective coating 270. On top of reflective coating 270 a phase change material is arranged that forms the actuator 250 being in direct contact with reflective coating 270 without any gaps. Bonded to a rear face of the plurality of prisms 270, a bottom face of casing 280 is shown, and side walls 290.

FIG. 3B shows a stage where light L is not coupled into light guide 230. Light L is incident via the light guide 230 on the reflective coating 270 of prism 260 after passing the gap 240, but the light is not coupled into the light guide 230 and the reflected light exits via an upper surface of light guide 230 and after traversing the light guide 230 due to the gap 240 in between the actuator 250 and light guide 230. In this situation, light L focused by the lenses onto actuator 250 at focus spot F is partially reflected by coating 270, the non-reflected part is absorbed by material of coating 270 and transmitted as heat into the phase changing material of actuator 250 that is in direct contact with coating 270. This effect locally heats up the phase change material of actuator 250 under the prism 260 which induces the phase change material of actuator 250. This induction causes the phase change material to expand, and insofar the phase change refers to a change from a smaller first volume to a larger second volume. This leads to a local increase of a thickness of the actuator 250 at an area of the focal spot F.

Figure 2:
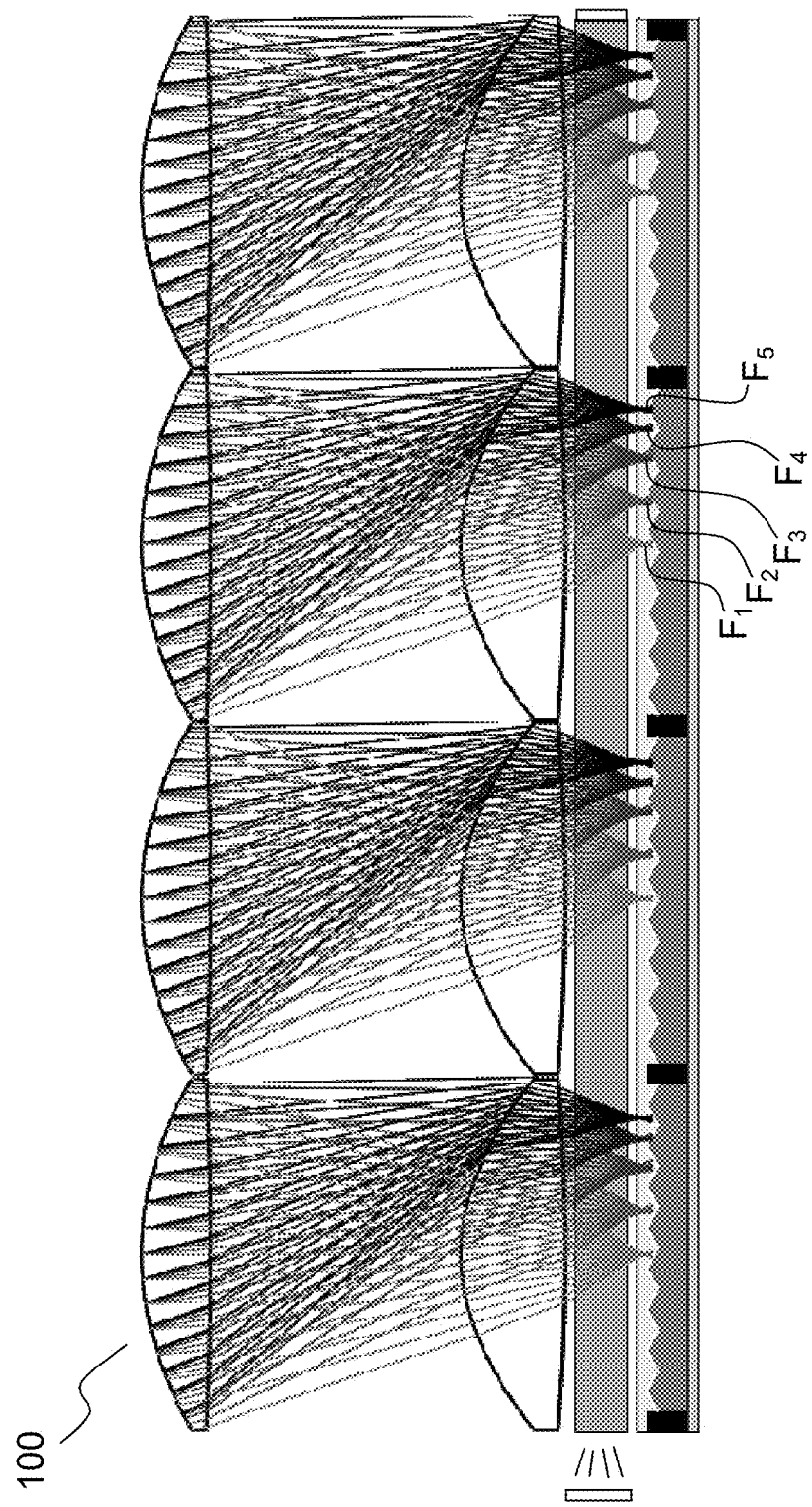
FIG. 2 is a cross-sectional view of the self-tracking concentrator 100, shows the change of the focal spot F using the optical device shown in FIG. 5 according to another aspect of the present invention.
Figure 5:
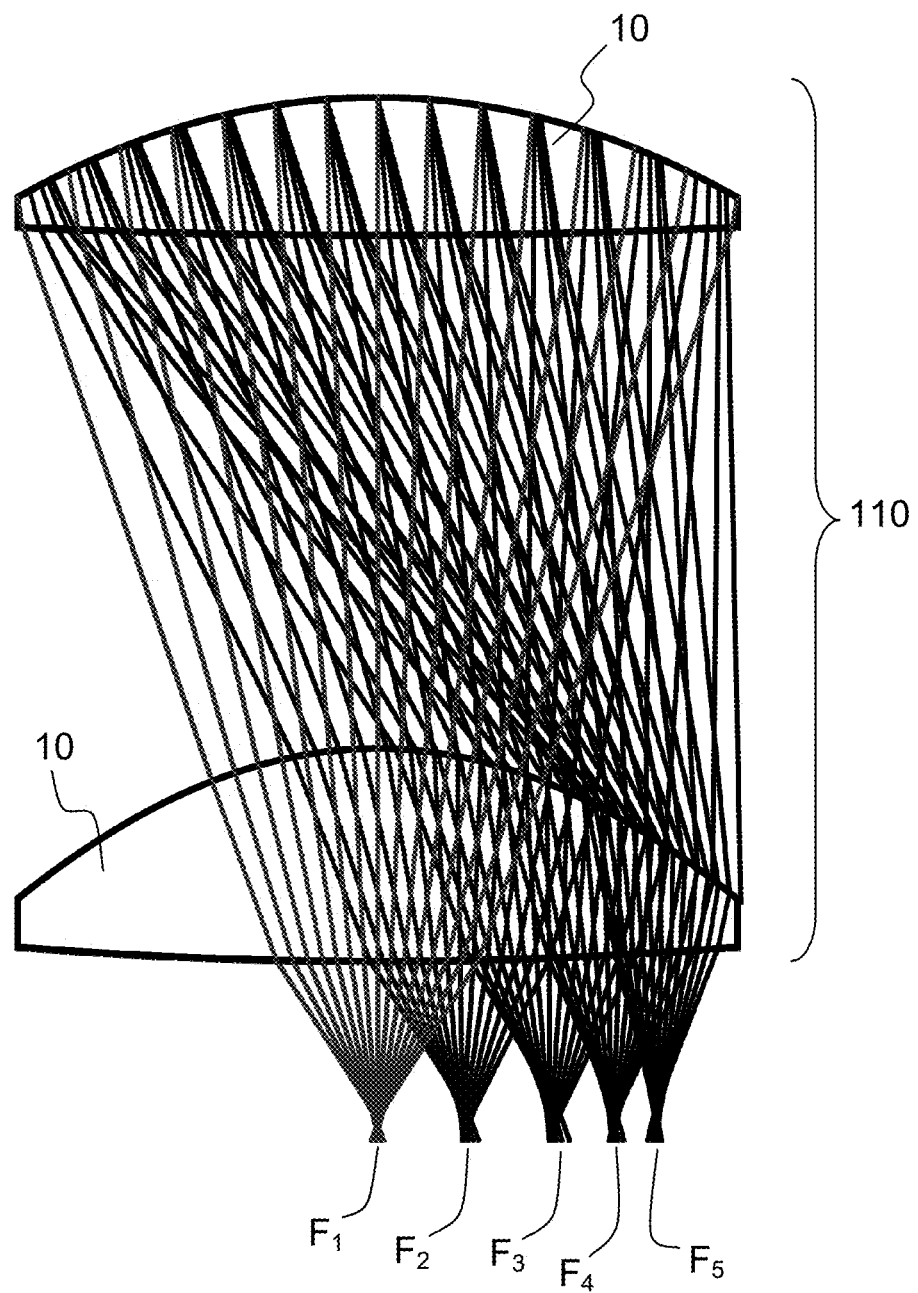
FIG. 5 shows a cross-sectional view of a device using a lens array providing for a flat Petzval field curvature, each lens of the lens array having two aspheric lenses, according to another aspect of the present invention.

Next, FIG. 3C shows the actuator 250 that has been activated and the gap 240 between light guide 230 and actuator 250 has been eliminated or closed, with an contact area of the upper surface of actuator 250 being in contact with a lower surface of light guide 230 so that light L can be coupled into the light guide 230. In particular, an area of the actuator 250 that is located above prism 260 has been locally expanded to an increased thickness to be in contact with light guide 230 so that reflected light L will not pass through a gap 240. Due to the expansion of the phase change material explained above, the phase change material of actuator 250 will expand in volume and the upper surface of actuator 250 presses as a membrane up against a lower surface of light guide 230. This allows the reflected part of the light L from coating to be coupled into the light guide 230. As the focus spot F moves to different locations, shown as focal spots $F_1$, $F_2$, $F_3$, $F_4$, and $F_5$ in FIG. 2, for example due to a movement of the position of the sun or other radiation source that generates light L, the actuation point where the heat is generated at the interface between coating 270 and the phase change material of actuator 250 increases in volume to coincide with a lateral position of the present location of the focal spot F caused by lens unit, as shown in FIGS. 2 and 5.

With this feature, at a limited surface contact area is created between upper surface of actuator 250 and lower surface of light guide 230, this area being in close proximity with the focal spot F. At other areas of the lower surface of light guide 230, the actuator 250 does not contact the light guide. Therefore, with this feature, it is possible that the limited surface contact area only contacts a small portion of each lower surface of light guide for each cell. For example, the contact area can be about 3%-15% of the entire surface area of the lower surface of light guide 230. By providing for a selective, adaptive, and limited-size contact surface, the gap 240 remains at most portions of the lower surface of light guide, serving as a cladding layer to maintain the light entering the light guide 230 inside the light guide.

With the device described above, it is possible to provide for a light concentrator device 100, 200 that is entirely passive, does not need any external signal measurement, processing and device control to provide for an adaptive self-tracking mechanism that does not rely on external devices and control. This is because the increased volume of actuator 250 that gets into contact with lower surface of light guide 230 inherently moves to a new lateral location of the focal spot F. When used in conjunction with the sun as a light source for light L, due to the relative slow movement of the position of the sun, the time constant for phase change can be relatively slow.

Figure 4A:
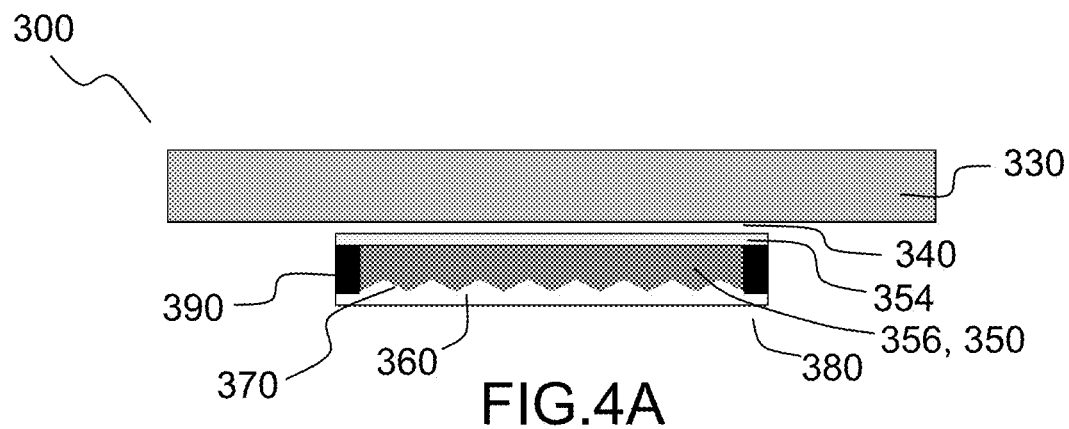
FIGS. 4A-4E shows an embodiment of the actuator 350, with FIGS. 3A showing the device 300 with the actuator 350 located below a light guide 330, with FIGS. 4B-4E showing different stages in illumination by light L, according to yet another aspect of the present invention.
Figure 4B:
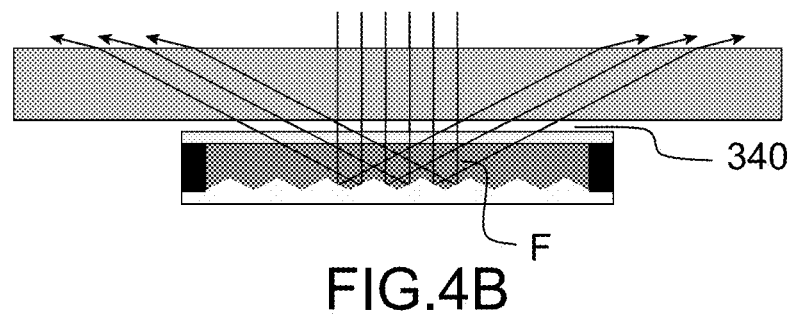
Figure 4C:
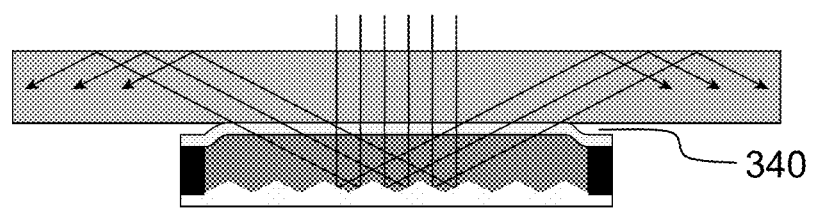
Figure 4D:
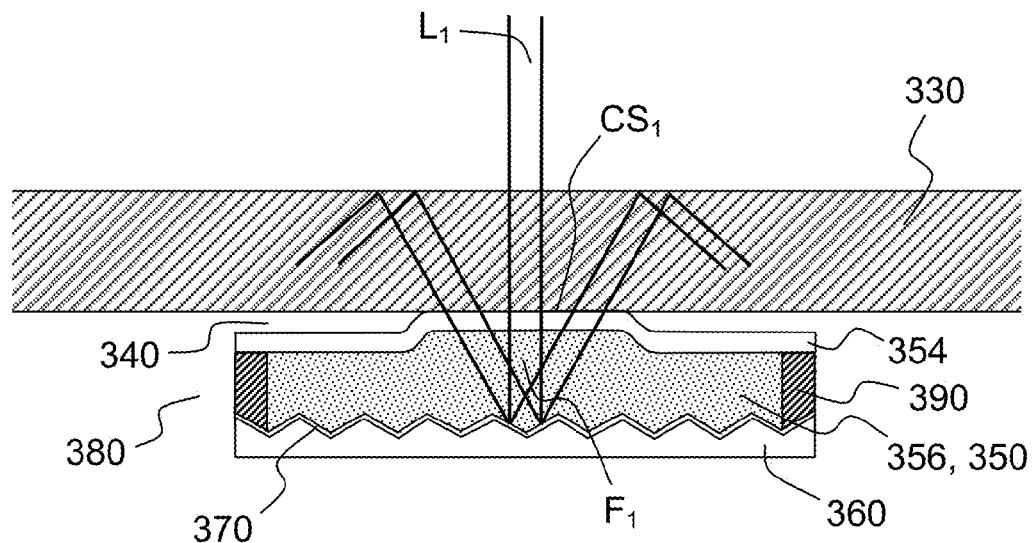

FIG. 4A shows a device 300 according to still another embodiment of the present invention, and FIGS. 4B-4E depict different stages of the light propagation with the device 300 shown in FIG. 4A. In this embodiment, FIG. 4A shows the solar concentrator device 300 having a lens unit (not shown) in which the actuator 350 is formed of a first layer 354 of unpatterned material, the first layer being thin and made of optically transmissive material, and a second layer 356 of a phase change material, a prism or an optical grating 360 with a reflective coating 370 that is covered by the actuator 350. First layer 354 can be made as a membrane such that it can expand with an expansion of the material of the second layer 356 and needs to provide for a certain elasticity. Again, not shown in this figure are the lenses, lens arrays, and other optical elements that focus the incident light onto the actuator 350. A sealed housing structure or sealed casing 380 is provided by the prisms 360, side walls 390, and the first layer 354 that forms an expandable membrane. Thereby, it is possible to contain the actuator 350 inside casing 380 when the material of the actuator 350 is in a liquid or gaseous state. Also, it is possible to cover casing 380 with an additional reflective layer. The device 300 of FIG. 4A can be arranged linearly or as an array of devices to form a device as shown in FIG. 1.

Figure 4E:
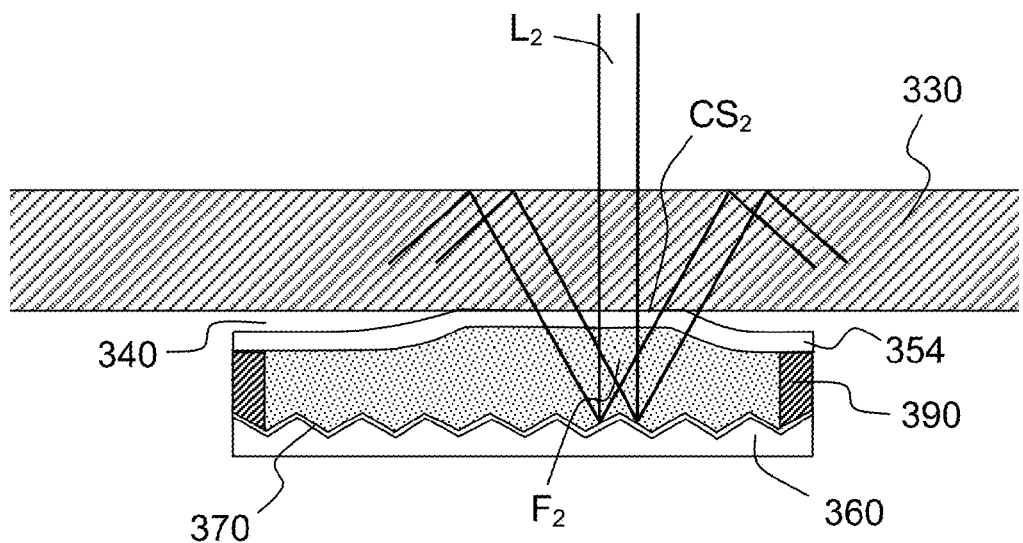

In this variant, light L is focused through first layer 354 that can be made elastomer that is partially optically transmissive, then passes through second layer 356 made of phase change actuation material onto the reflective coating 370 of prisms 360. Again, light L focused by the lenses is now partially reflected at coating 370. The non-reflected part is absorbed by coating 370 and transmitted as heat to second layer 356 of phase change actuation material. This locally heats up the phase-changing actuation material of second layer 356 and induces a phase change, and an expansion of the volume of second layer 356, so that an upper surface of first layer 354 will come into direct contact with a lower surface of light guide 330, to close gap 340 at least partially. This is shown in detail in FIG. 4D, where upper surface of first layer 354 is in contact with lower surface of light guide 330, with a contact surface $CS_1$ due to the phase change that occurred in second layer 356 that caused an expansion of the volume at a focal spot $F_1$. As the focus spot F moves laterally, for example due to a movement of the position of the sun or other radiation source that generates light L, the focal spot F moves also. Consequently, the actuation sport where the heat is generated at the interface between reflective coating 370 and the phase change material of second layer 356 of actuator 350 changes in lateral position, as shown in FIG. 4E, where the focal spot $F_2$ has moved to the right, and thereby the contact surface $CS_2$ has also moved to the right.

In a variant, the material used for the actuator 250 or second layer 356 that acts as an actuator can have light absorbing particles inside the phase phase-change material. These particles can be made to only absorb a certain wavelength range of the spectrum of the incident light L. Also, it is possible that these particles can act as up-converting elements, so that they transform longer wavelength light into shorter wavelength light. The self-tracking mechanism described with the above embodiments requires a light-induced actuator, in the above variants a solar-induced actuator 150, 250, 350, and the material used for the actuator can be a thermal phase-change actuating material which can actuate locally depending on the location of focal spot F generated from light L by lens or an array of lenses. Thermal energy from the sunlight or other radiation source that generates light L is used to induce a phase-change in the material of actuators 150, 250, 350. By this the device aligns itself to the position of the focal spot F and allows for highly efficient coupling into a light guide 130, 230, 330, for example but not limited to a slab light guide. The light guide 130, 230, 330 itself acts as a secondary concentration device, combining the coupled light of multiple lenses and corresponding actuators, and either transports it to a photovoltaic cell for electrical conversion or into a building for daylighting purposes.

In a variant of the embodiment shown in FIG. 4A, the phase change material of second layer 356 changes a phase from solid material to liquid material upon absorption of portions of light L that was not reflected. In the liquid state, the material is contained at second layer 356 by virtue of the presence of the first layer 354 that serves as an optical light guide and as a seal. For example, it could be made of paraffin wax or a material with equivalent properties for the above described purpose. Paraffin wax are the common name for hydrocarbon chains $CnH2n+2$, and its mixtures. Such hydrocarbon chains with more than 20 carbon atoms are solid at room temperature with a melting temperature dependent on the length of the carbon chain. In this way paraffin wax can be chemically tailored to have reliable melting points almost anywhere between 18° C. and 130° C. Paraffin wax is a preferable reversible phase change actuator material for actuator 50, 250, 350 because it has a very large volume expansion of 10% to 20% on phase change and can operate even when loaded with hundreds of Megapascals (MPa) of pressure. It also has a response time that is fast enough to be able to track the motion of the sun. The energy for actuation from sunlight is given by the non-reflected portions of the light L that is not reflected by the reflective coating 70, 270, 370 on the prisms 60, 260, 360. In contrast to some of the background art solutions, the solar spectrum is not divided into two parts with this device, instead a portion of it is taken from all the wavelengths to be guided into light guide. A solar concentration system that uses the device 100, 200, 300 as described herein can benefit from the increased efficiency of multi-junction solar cells, which require a larger spectral bandwidth, as none of the initial bandwidth of the light L gets lost.

In yet another variant of the embodiment shown in FIG. 4A, the phase change actuation material of second layer 356 changes its phase from a liquid state to a gaseous state. For example, the material that could be used is methanol. Methanol features a low vapor pressure and can easily generate a phase change, namely create a vapor bubble, through focused light L that is absorbed. Any surface in contact with second layer 356 that provides for the phase change, for example the protective first layer 354, or the layer of material that is located underneath the reflective layer 370 can also be configured to aid in the phase change and the generation of vapor bubbles of the second layer. This surface structuring can be but is not limited to plasmonic absorptive structures or nano-particles in layer underneath the reflective layer 370.

Next, a method of manufacturing the device 300 as discussed above is described, in accordance with still another aspect of the present invention. In one variant, a thin and transparent elastomer material that forms the prisms 360 is patterned with a line prism array using molding or embossing. Next, prisms 360 is attached to a housing 380. Thereafter, a reflective coating 370 is then deposited onto the prisms 360. The reflective coating 370 is configured such that it reflects most of the light but absorbs a small portion over the entire light spectrum, for example the solar spectrum. The reflected portion will be coupled into light guide 330 whereas the absorbed portion is used to generate heat and activate the actuator, i.e. is used to provoke a phase change of the actuator material of the actuator 350. The device 300 is then filled with a phase-changing actuation material to form second layer 356 and closed on top of the phase change material to form actuator 350 with a first layer 354.

In a variant of manufacturing the device, the thin and transparent elastomer material is attached to the housing 280 without being patterned, to form the protective first layer 354. Paraffin is then filled into the device on top of the thin and transparent elastomer material forming the first layer 354 to form the second layer 356. Thereafter, the second layer 356 of paraffin wax is enclosed between the first layer 354 and an element patterned with reflective prisms 360, 370. As discussed above, light L can be reflected from the reflective layer 370 of prisms 360, while the phase change actuation material of second layer 356 can be activated by the portion that is absorbed by the prisms 360. The actuator 350 with first and second layer 354, 356 is then positioned in close proximity below a light guide 330 that can be made of a glass slab, leaving a small gap 340 inbetween an upper surface of actuator 350 and a lower surface of light guide 330, the gap acting as a cladding layer. A lens or lenslet array on top of the light guide 330 can used to focus sunlight or light from an other source locally on the actuator 350 and the reflective layer 370 of prisms 360.

For example, experimental results have been made with the device according to the various embodiments of the present invention. The prism and reflective layer has been made by a thin membrane (50 μm-100 μm) is manufactured with a two-component material (OSTEFlex) before being attached to a steel housing. Paraffin wax (Merck™, melting point 42° C.-44° C.) is flown into the cavities provided by the prism structures to cover the entire side of the thin membrane with the prisms, to form the actuation layer. The backside is then sealed by a piece of glass. Next, a 1 mm²×5 mm²×50 mm² polished fused silica glass layer is arranged above the prisms and above the actuators, to provide for a light guide. Using a 300 W solar simulator (1 sun output), light was focused with an optical system having 30 mm focal length and 25 mm aperture onto the actuators. Next, the light output at the exit facets of the light guide has been compared with and without the actuators, and it has been shown that due to the actuation, an increased intensity could be measured at the exit facet of the light guide after a few seconds.

According to another aspect of the present invention, in the use of concentration solar energy, solar concentrators are tailored to the field of view and energy concentration at focal spot F required. For small field of view, for example when the sun is followed only for a partial period of the day covering an angular range of 5° to 15°, a system using the device 100, 200, 300 as discussed above, an external mechanical solar tracker to follow a position of the sun is unnecessary, and a single lens unit 10, or a lens array 110 can be used for covering the angular range. Thereby, such a system can be devoid from any external mechanical moving parts.

If a system needs to be designed to cover a larger field of view of the light L, more complex lens systems are used to provide acceptable off-axis performance over the entire field of view. For example, as shown in FIG. 5, the lens system shown uses two aspheric lenses to achieve a constant small focal spot over an angular range of 23°. While the sun light can still be tracked by an additional mechanical device, this angular range is sufficient to cover the seasonal variations of the sun, without the need to perform mechanical tracking of the seasonal variations.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A device for self-tracking a light source, comprising:
   an focusing optical device configured to focus incoming light to a focal spot;
   an adaptive device configured to reflect the light of the focal spot and arranged to provide for a phase change at an area of the focal spot of the incoming light to generate a reflected light; and
   a light guide located between the focusing optical device and the adaptive device, the light guide configured to capture the reflected light of the adaptive device;
   wherein the adaptive device includes an actuation layer and a reflective prism layer, and
   wherein a lower surface of the light guide and an upper surface of the actuation layer is such that upon the phase change at the area of the focal spot, the actuation layer increases in thickness at the area of the focal spot, to contact the lower surface of the light guide, and at areas other than the area of the focal spot, a gap acting as a cladding is provided between the actuation layer and the light guide.

2. The device according to claim 1, wherein the focusing optical device provides for a flat Petzval field curvature.

3. The device according to claim 1, wherein the focusing optical device includes an array of lens units, and the adaptive device includes an array of actuator units and an array of reflective layers, a focal spot of each lens unit of the array of lens units located at a corresponding one of the actuator units,
   wherein the light guide is configured to capture reflected light from the array of actuator units reflected by the array of reflective layers to guide the captured light to an exit surface of the light guide.

4. The device according to claim 3, wherein the light guide includes a slab waveguide, and at least one side surface of the waveguide is coated with a reflective layer.

5. The device according to claim 1, wherein the adaptive device includes a housing and a phase change material that coverts either from solid state to liquid state or from liquid state to gaseous state.

6. The device according to claim 1, wherein the adaptive device includes a prism structured reflective layer, the prism structured reflective layer configured to absorb a portion of the incoming light, and configured to reflect another portion of the incoming light, wherein the absorbed portion of the incoming light activates the phase change of the adaptive device.

7. The device according to claim 6, wherein the prism structured reflective layer includes a backside membrane that includes at least one of nano-particles and plasmonic structured to facilitate the phase change of the adaptive device.

8. The device according to claim 1, wherein the adaptive device further comprises:
   an optically transparent membrane;
   a partially reflective prism; and
   a phase change layer located between the optically transparent membrane and the partially reflective prism.

9. The device according to claim 8, wherein the phase change layer includes an additional material to facilitate the phase change of the adaptive device.

10. The device according to claim 1, wherein a material used for the adaptive device includes a phase change material and an up-converting material that transforms radiation from longer wavelengths into shorter wavelengths.

11. A device for converting solar light into electrical energy, comprising:
   an focusing optical device configured to focus incoming solar light to a focal spot;
   an adaptive device configured to reflect the incoming solar light of the focal spot and arranged to provide for a phase change at an area of the focal spot of the solar incoming light to generate a reflected light;
   a light guide located between the focusing optical device and the adaptive device, the light guide configured to capture the reflected light of the adaptive device, and to guide the light to an exit surface; and
   a solar cell arranged at the exit surface to capture the guided light exited by the exit surface to generate electrical energy;
   wherein the adaptive device includes an actuation layer and a reflective prism layer, and
   wherein a lower surface of the light guide and an upper surface of the actuation layer is such that upon the phase change at the area of the focal spot, the actuation layer increases in thickness at the area of the focal spot, to contact the lower surface of the light guide, and at areas other than the area of the focal spot, a gap acting as a cladding is provided between the actuation layer and the light guide.

* * * * *